United States Patent
Yamashita

(10) Patent No.: US 7,315,292 B2
(45) Date of Patent: Jan. 1, 2008

(54) ELECTRIC CURRENT ADJUSTMENT OF LIGHT EMITTING ELEMENT OF DISPLAY DEVICE

(75) Inventor: Atsuhiro Yamashita, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 498 days.

(21) Appl. No.: 10/813,630

(22) Filed: Mar. 31, 2004

(65) Prior Publication Data

US 2004/0246202 A1 Dec. 9, 2004

(30) Foreign Application Priority Data

Mar. 31, 2003 (JP) ............... 2003-097055
Mar. 31, 2003 (JP) ............... 2003-097056

(51) Int. Cl.
*G09G 3/32* (2006.01)
(52) U.S. Cl. ............... 345/82; 345/76; 345/77
(58) Field of Classification Search ............... 345/82, 345/83, 76, 77, 690; 315/169.1, 169.3
See application file for complete search history.

(56) References Cited

U.S. PATENT DOCUMENTS 6,469,405 B1* 10/2002 Moya et al. ............... 307/130
6,774,877 B2* 8/2004 Nishitoba et al. ............... 345/76
2003/0063078 A1* 4/2003 Hanari et al. ............... 345/204
2003/0098828 A1* 5/2003 Hunter et al. ............... 345/76
2004/0026723 A1* 2/2004 Miyazawa ............... 257/277

FOREIGN PATENT DOCUMENTS

| JP | 10-312173 | 11/1999 |
|----|-----------|---------|
| JP | 2002-132218 A | 5/2002 |
| JP | 2003-323154 A | 11/2003 |

* cited by examiner

*Primary Examiner*—Chanh D. Nguyen
*Assistant Examiner*—Calvin Ma
(74) *Attorney, Agent, or Firm*—McDermott Will & Emery LLP

(57) ABSTRACT

In a pixel circuit composing a digital-driven organic EL display device, an organic light emitting element which emits light by the supply of electric current, and two driving transistors for controlling the supply of electric current to the organic light emitting element are connected in series. The driving transistor functions as an electric current adjustment element which adjusts an electric current flowing through the organic light emitting element. When the electric current flowing through the organic light emitting element decreases by the degradation of the organic light emitting element, decrease in temperature and the like, the driving transistor acts for increasing the electric current.

6 Claims, 14 Drawing Sheets

ELECTRIC CURRENT ADJUSTMENT OF LIGHT EMITTING ELEMENT OF DISPLAY DEVICE

BACKGROUND OF THE INVENTION

1. Field of the Invention

The present invention relates to a display element and a display device. The present invention especially relates to the digital-driven display element, and the digital-driven display device which are provided with a plurality of pixel circuits.

2. Description of the Related Art

An organic electroluminescent display device (hereinafter also called "an organic EL display device" or "an organic EL panel") receives attention as a new flat display device. The organic EL display device is presumed to overtake a liquid crystal display device, which is currently widely used, in the near future, and is in the process of fierce development competition toward actual use.

There are mainly two types of driving methods for the organic EL display device. One is an analog driving method, and the other is a digital driving method. In the analog driving method, an electric current an amount of which is in accordance with data voltage is supplied to each organic EL element, so that the organic EL element emits light with luminance in accordance with the data voltage. Various methods are proposed as for the digital driving method. Taking a case of a time gradation method, for example, since a pulse current having a duty ratio in accordance with data voltage is supplied to each organic EL element, the organic EL element emits light for a time period in accordance with the data voltage to express multiple-gradation.

In a subfield driving method of the time gradation method, a single field (frame) period, which is a display period of a single frame, is divided into a plurality of subfield (subframe) periods. Controlling the on/off of lighting in each subfield period makes the organic EL element emit light for a time period in accordance with data voltage. In this case, since the same amount of electric current is supplied to the organic light emitting elements, the organic light emitting elements emit light with the same luminance, but difference in the length of lighting time expresses gradation. The light emission period of each subfield has length of 2 to the nth power (n=0, 1, 2, . . . N−1). The on/off of the light emission period set at length of, for example, 1, 2, 4, 8, 16, 32, 64, and 128 expresses 256 levels of gray.

In the organic EL panel adopting the time gradation method described above, it is preferable to operate a driving transistor, which drives the organic light emitting element at a constant current, in a linear region for the purpose of reducing the effect of variations in the transistors.

See, for example, Japanese Patent Laid-Open Publication No. H10(1998)-312173.

According to the digital driving method, however, when the driving transistor is operated in the linear region, there is a problem that variation in electric current due to variation in temperature and degradation with time is large, as compared with the analog driving method in which the driving transistor is operated in a saturation region. The large variation in electric current, which is supplied to the organic light emitting elements, causes dispersion of the luminance of the organic light emitting elements, so that there is the fear of the degradation of display quality.

SUMMARY OF THE INVENTION

Considering such a situation described above, and an object of the present invention is to provide the technology of reducing dispersion of luminance of digital-driven display elements. Another object of the present invention is to provide the technology of reducing decrease in luminance of the digital-driven display element due to degradation with time. Further another object of the present invention is to provide the technology of preventing the occurrence of thermal runaway in a digital-driven display device.

One aspect of the present invention relates to a display element. The display element being a digital-driven display element comprises: a light emitting element which emits light when an electric current is supplied thereto; a driving transistor which controls the supply of the electric current to the light emitting element and is operated in a linear region; and an electric current adjustment element which is connected to the light emitting element and the driving transistor in series, to adjust the electric current flowing through the light emitting element.

By providing the electric current adjustment element, it is possible to reduce variation in electric current caused by variation in temperature, the degradation of the light emitting element with time and the like, and hence variation in luminance is reduced.

The electric current adjustment element may be a transistor. The transistor may be connected so that when the voltage between both electrodes of the light emitting element increases due to variation in temperature and variation with time, an operating point shifts in the direction of relieving the increase in voltage. A signal same as that inputted to a gate electrode of the driving transistor may be inputted to a gate electrode of the transistor. Thus, it is possible to realize electric current adjustment with the simple structure. A control signal for variably controlling the electric current flowing through the light emitting element may be inputted to a gate electrode of the transistor. Therefore, it is possible to further effectively adjust the electric current.

Another aspect of the present invention relates to a display device. In this display device, the display elements of any type described above are arranged in matrix.

Further another aspect of the present invention relates to a display device. The display device is a digital-driven display device comprising a plurality of pixel circuits. Each of the plurality of pixel circuits comprises a light emitting element which emits light when an electric current is supplied thereto, and a driving transistor which controls the supply of the electric current to the light emitting element and is operated in a linear region. The display device further comprises a power source line through which the electric current is supplied to the light emitting element of each pixel circuit. The power source line branches from a first power source on the side of high electric potential to each pixel circuit at a first node, and converges from each pixel circuit at a second node, and then is connected to a second power source on the side of low electric potential. An electric current adjustment circuit which adjusts the electric current flowing through the light emitting element is disposed between the first node and the first power source. Since the single electric current adjustment circuit can adjust the electric current flowing through the light emitting elements of the whole pixel circuits, it is possible to simplify the circuit structure.

When the electric current at the first node decreases, the electric current adjustment circuit may increase the electric potential of the first node, in order to move an operating point of the driving transistor in a direction of increasing the electric current. The electric current adjustment circuit may be either of a transistor and a resistor element.

Further another aspect of the present invention also relates to a display device. The display device is a digital-driven display device comprising a plurality of pixel circuits. Each of the plurality of pixel circuits comprises a light emitting element which emits light when an electric current is supplied thereto, and a driving transistor which controls the supply of the electric current to the light emitting element and is operated in a linear region. The display device further comprises a power source line through which the electric current is supplied to the light emitting element of each pixel circuit. The power source line branches from a first power source on the side of high electric potential to each pixel circuit at a first node, and converges from each pixel circuit at a second node, and then is connected to a second power source on the side of low electric potential. An electric current adjustment circuit which adjusts the electric current flowing through the light emitting element is disposed between the second node and the second power source. According to this aspect, as with the foregoing one, since the single electric current adjustment circuit can adjust the electric current flowing through the light emitting elements of the whole pixel circuits, it is possible to simplify the circuit structure.

When the electric current at the second node decreases, the electric current adjustment circuit may decrease the electric potential of the second node, in order to move an operating point of the driving transistor in a direction of increasing electric current. The electric current adjustment circuit may be either of a transistor and a resistor element.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiments are not necessarily essential to the invention.

First Embodiment

Figure 1:
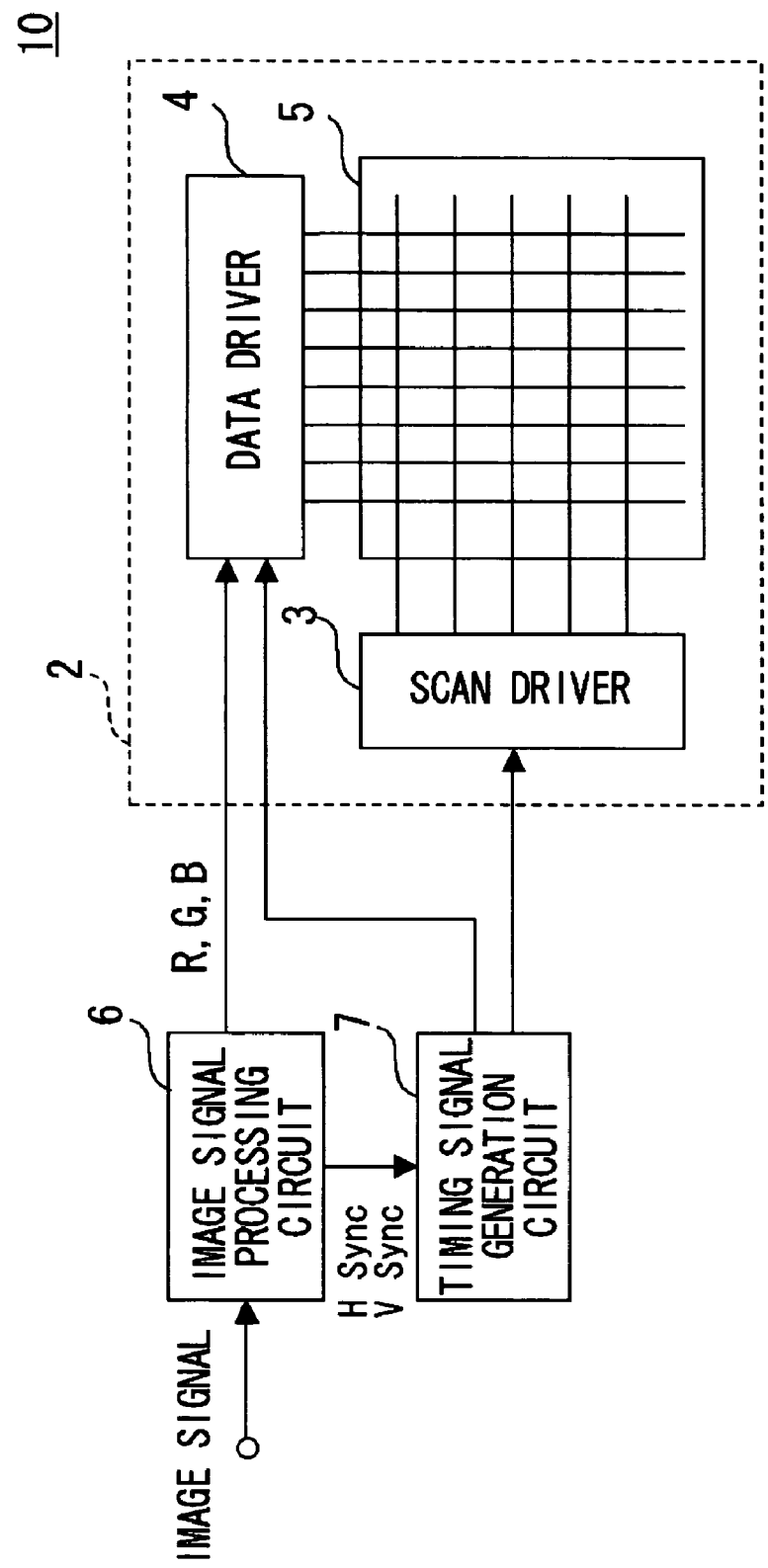
FIG. 1 is a block diagram showing the structure of an organic EL display device according to a first embodiment.

FIG. 1 shows the structure of an organic EL display device 10 according to a first embodiment. The organic EL display device 10 comprises an organic EL display unit 2, an image signal processing circuit 6 which processes an image signal, and a timing signal generation circuit 7 which generates timing signals which control the timing of display. The organic EL display unit 2 comprises an organic EL panel 5 in which a plurality of pixels are arranged in matrix, a scan driver 3 which supplies the organic EL panel 5 with scan signals, and a data driver 4 which supplies the organic EL panel 5 with luminance data signals.

The image signal processing circuit 6, which subjects the inputted image signal to necessary processing, outputs image signals of three primary colors of R, G and B to the data driver 4. The image signal processing circuit 6 outputs a horizontal synchronization signal $H_{Sync}$ and a vertical synchronization signal $V_{Sync}$ to the timing signal generation circuit 7. The timing signal generation circuit 7 generates the timing signals for controlling the timing of display on the basis of the horizontal and vertical synchronization signals $H_{Sync}$ and $V_{Sync}$, and supplies the timing signals to the scan driver 3 and the data driver 4.

Figure 2:
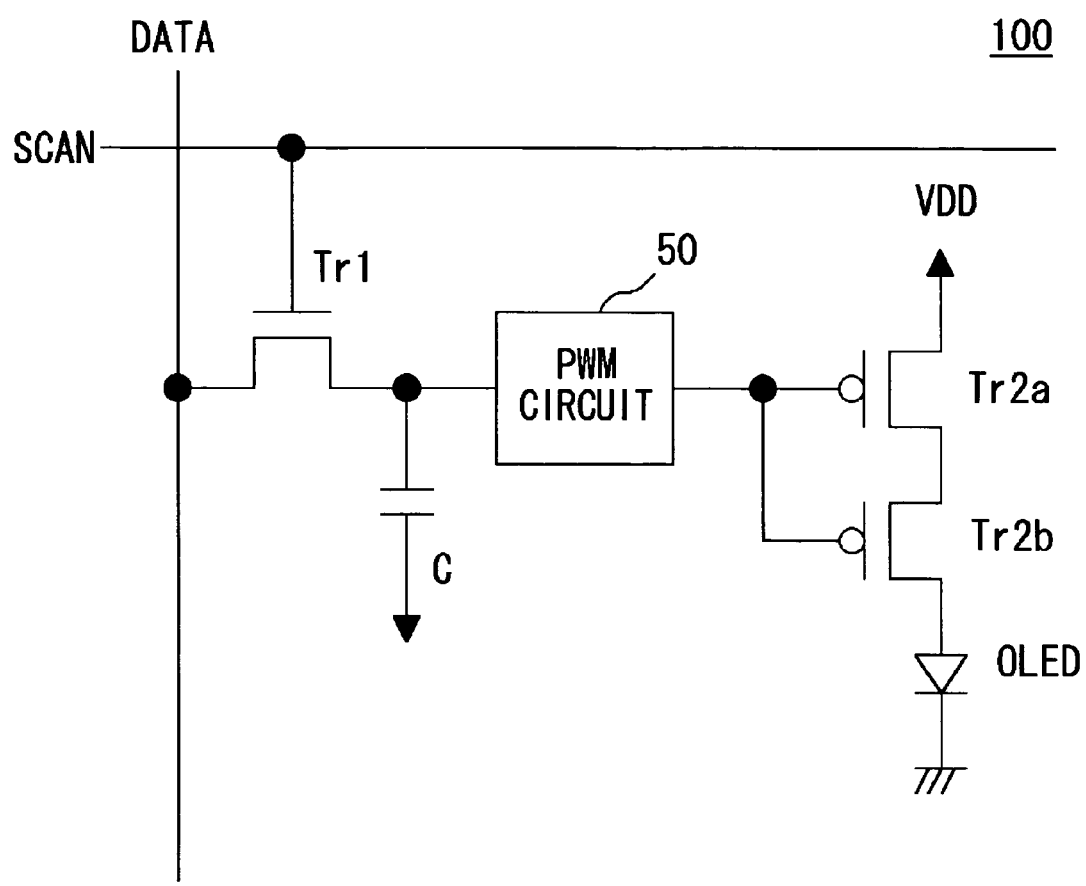
FIG. 2 is a circuit diagram showing the structure of a pixel circuit of a single pixel of an organic EL panel.

FIG. 2 shows the structure of a pixel circuit 100 of a single pixel of the organic EL panel 5 according to this embodiment. The pixel circuit 100 comprises an organic light emitting element OLED, a switching transistor Tr1 which controls the timing of the writing of data to the organic light emitting element OLED, driving transistors Tr2a and Tr2b which controls the energization of the organic light emitting element OLED, a holding capacitor C, a pulse width modulation (PWM) circuit 50 which modulates luminance data voltage into pulse width, a scan line SCAN for transmitting the scan signal, a data line DATA for transmitting luminance data, and a power supply line $V_{DD}$ for supplying the organic light emitting element OLED with an electric current. The power supply line $V_{DD}$ supplies an electric current in order to make the organic light emitting element OLED emit light. The data line DATA transmits the signal of luminance data to control the luminance of each organic light emitting element OLED. The scan line SCAN transmits the scan signal to control the light emission timing of each organic light emitting element OLED.

The pixel circuit 100 according to this embodiment is provided with two driving transistors Tr2a and Tr2b connected in series. One driving transistor Tr2b, as described later, functions as an electric current adjustment element which adjusts the electric current flowing through the source-drain of the driving transistors Tr2a and Tr2b and the organic light emitting element OLED. Actually, an electric current adjustment function is realized by the synergy of the driving transistors Tr2a and Tr2b, so that both the driving transistors Tr2a and Tr2b may be called the electric adjustment elements. Providing the electric adjustment element makes it possible to reduce variation in luminance, due to the effect of temperature of the organic light emitting element OLED or degradation with time.

The gate electrode of the switching transistor Tr1 is connected to the scan line SCAN. The source electrode of the switching transistor Tr1 is connected to the data line DATA, and the drain electrode thereof is connected to the PWM circuit 50. The switching transistor Tr1 has any of single-gate structure, double-gate structure, and multi-gate structure with three or more gate electrodes. The switching transistor Tr1 is either of an N-channel transistor and a P-channel transistor. The source electrode and the drain electrode may be reversed to each other.

The source electrode of the driving transistor Tr2a is connected to the power supply line $V_{DD}$. The drain electrode of the driving transistor Tr2a is connected to the source electrode of the driving transistor Tr2b, and the gate electrode thereof is connected to the PWM circuit 50. The source electrode of the driving transistor Tr2b is connected to the drain electrode of the driving transistor Tr2a. The drain electrode of the driving transistor Tr2b is connected to the anode of the organic light emitting element OLED, and the gate electrode thereof is connected to the PWM circuit 50. The two driving transistors Tr2 are connected in series in this embodiment, but three or more driving transistors Tr2 may be provided.

The anode of the organic light emitting element OLED is connected to the drain electrode of the driving transistor Tr2b, and the cathode thereof is grounded. One end of the holding capacitor C is connected to the drain electrode of the switching transistor Tr1, and the other end is connected to not-illustrated wiring. The other end of the holding capacitor C may be connected to the power supply line $V_{DD}$. The PWM circuit 50 is disposed between the drain electrode of the switching transistor Tr1 and the gate electrodes of the driving transistors Tr2a and Tr2b.

The operation of the organic EL display device 10 having the foregoing structure will be described. First, the data driver 4 prepares luminance data of each line and supplies it to each data line DATA. At this time, since the scan driver 3 sends the scan signal to the horizontal scan line SCAN into which data is written, the switching transistors Tr1 of the pixels in the horizontal line are turned on. Luminance data set in each data line DATA is set in the holding capacitor C, and is inputted to the PWM circuit 50. The PWM circuit 50 modulates the voltage of inputted luminance data into a pulse signal having width corresponding to the voltage. The pulse signal having predetermined amplitude becomes active in a period corresponding to the luminance data. The pulse signal outputted from the PWM circuit 50 is inputted to the gate electrodes of the driving transistors Tr2a and Tr2b. Since the driving transistors Tr2a and Tr2b are turned on only when the pulse signal is active, a predetermined amount of electric current is supplied to the organic light emitting element OLED, so that the organic light emitting element OLED emits light. The foregoing operation is repeated for every horizontal line to display an image of a single frame.

Figure 3:
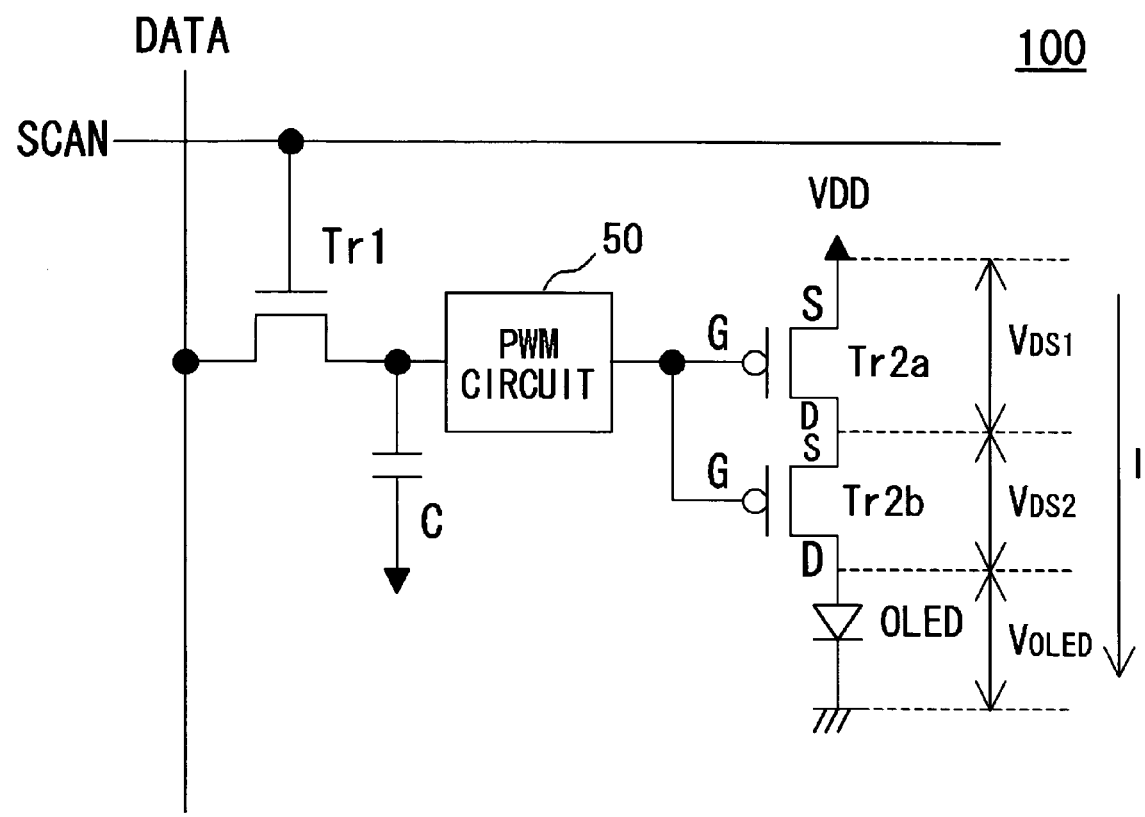
FIG. 3 is a circuit diagram showing the relation among the source-drain voltage of driving transistors Tr2a and Tr2b, and the voltage between both electrodes of an organic light emitting element OLED.

FIG. 3 shows the relation among the source-drain voltage of the driving transistors Tr2a and Tr2b, and the voltage between both electrodes of the organic light emitting element OLED. The driving transistors Tr2a and Tr2b and the organic light emitting element OLED are connected in series, so that the same amount of electric current I flows therethrough, provided that leakage current is not taken into consideration. The following equation holds:

$$V_{DD}=V_{DS1}+V_{DS2}+V_{OLED}$$

wherein, $V_{DS1}$ represents the source-drain voltage of the driving transistor Tr2a, $V_{DS2}$ represents the source-drain voltage of the driving transistor Tr2b, and $V_{OLED}$ represents the voltage between both electrodes of the organic light emitting element OLED.

Figure 4:
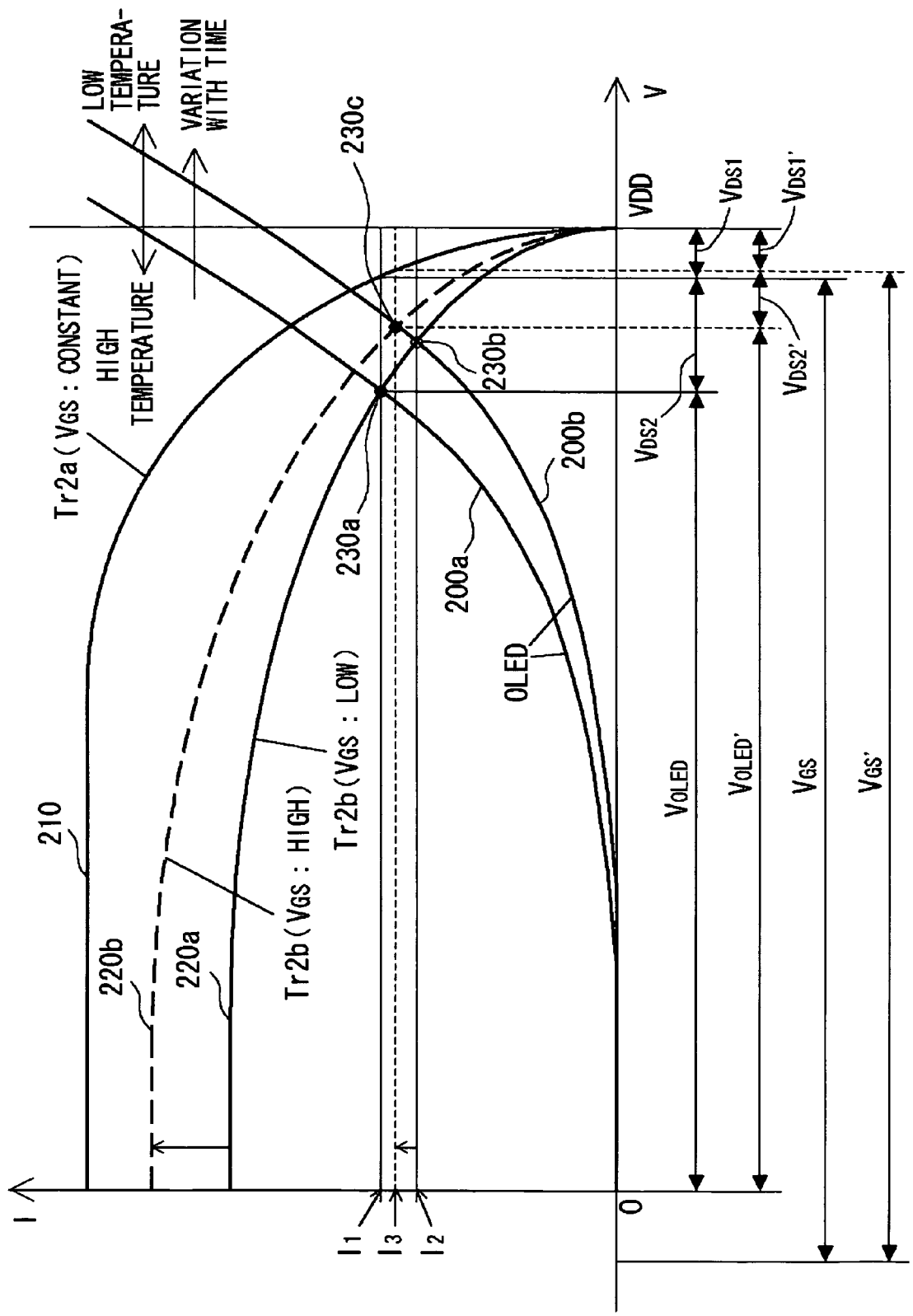
FIG. 4 is a graph explaining that an electric current adjustment element reduces variation in electric current, when the electric current flowing through the organic light emitting element OLED varies due to variation in temperature and variation with time.

FIG. 4 explains that the electric current adjustment element reduces variation in electric current, when the electric current flowing through the organic light emitting element OLED varies due to variation in temperature and variation with time. 200a is the characteristic curve of the organic light emitting element OLED at some point in time t1. 210 is the characteristic curve of the driving transistor Tr2a, and 220a is the characteristic curve of the driving transistor Tr2b. At this time, the operating point of the driving transistor Tr2b is 230a, and an electric current of a current value I1 flows through the organic light emitting element OLED and the driving transistors Tr2a and Tr2b.

It is known that an electric current becomes hard to flow through the organic light emitting element OLED with the lapse of light emission time, and the luminance decreases. In other words, the characteristic curve of the organic light emitting element OLED shifts in a right direction in FIG. 3, in accordance with degradation with time. The characteristic curve of the organic light emitting element OLED also shifts in the right direction in accordance with decrease in temperature. When the luminance and electric current decrease due to degradation with time, the temperature of the display panel decreases, and the characteristic curve shifts in the direction of further decreasing the electric current. Therefore, there is the fear of a vicious cycle in which the luminance further decreases.

When the characteristic curve of the organic light emitting element OLED at some point in time t2 shifts to 200b due to variation with time or decrease in temperature, the operating point moves to 230b, and the current value decreases to I2. At this time, since the operating point of the driving transistor Tr2a also moves rightward, the electric potential of the source electrode of the driving transistor Tr2b increases, so that the gate-source voltage $V_{GS}$ of the driving transistor Tr2b increases. Then, the characteristic curve of the driving transistor Tr2b changes to 220b, so that the operating point becomes 230c, and the current value increases to I3. The electric current decreases to I2 when only a single driving transistor is provided, but the electric current becomes I3 when the two driving transistors are connected in series. Therefore, it is possible to reduce the decrease in electric current due to decrease in temperature and variation with time.

When temperature increases, on the other hand, the characteristic curve of the organic light emitting element OLED shifts in a left direction, so that the operating point shifts in an upper left direction, and the electric current increases. Then, since the temperature of the panel further increases, there is the fear of occurrence of thermal runaway. Also in this case, according to the pixel circuit 100 of this embodiment, since the electric current adjustment function works to shift the operating point in the direction of decreasing a current value, the thermal runaway is prevented. To be more specific, when the operating point 230a shifts in the upper left direction with increase in temperature, the gate-source voltage $V_{GS}$ of the driving transistor Tr2b decreases, and hence the characteristic curve of the driving transistor Tr2b shifts downward. Thus, the operating point shifts in a lower left direction, so that it is possible to reduce increase in electric current.

By providing a plurality of driving transistors, the inclination of the linear region of the transistor connected to the organic light emitting element OLED becomes gentle. Thus, also there is an effect that variation in temperature and degradation with time are hard to have effect on the organic light emitting element OLED.

Figure 5:
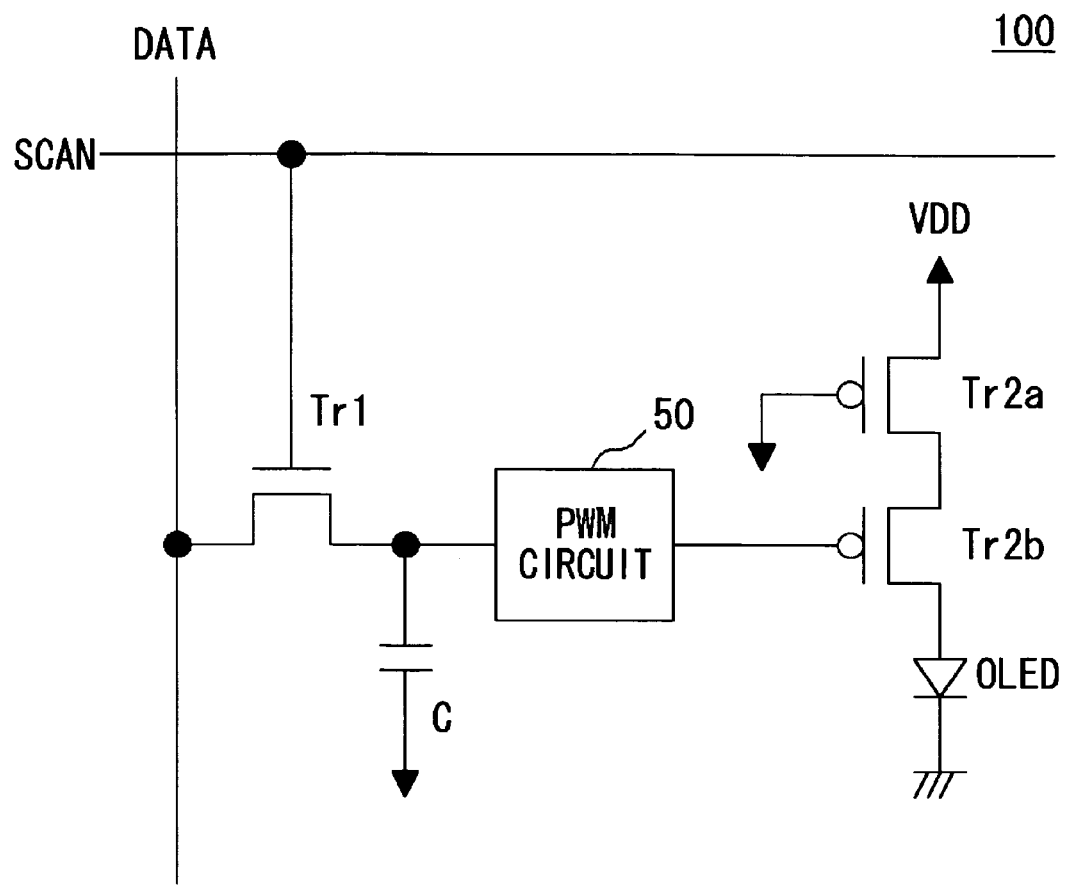
FIG. 5 is a circuit diagram of another example of the pixel circuit.

FIG. 5 shows another example of the pixel circuit 100. In the example of FIG. 5, a control signal, which is generated by a not-illustrated electric current control section to variably control the electric current, is inputted to the gate electrode of the driving transistor Tr2a, functioning as the electric current adjustment element. Thus, since it is possible to actively control the electric current flowing through the organic light emitting element OLED, further effective electric current control is realized. The electric current adjustment function of this pixel circuit 100 will be described with reference to FIG. 4. By adjusting the gate voltage of the driving transistor Tr2a, the characteristic curve 210 shifts in a vertical direction. In addition to this, the gate-source voltage $V_{GS}$ of the driving transistor Tr2b increases or decreases, so that the characteristic curve 220a shifts in the vertical direction, and the operating point 230a moves.

Figure 6:
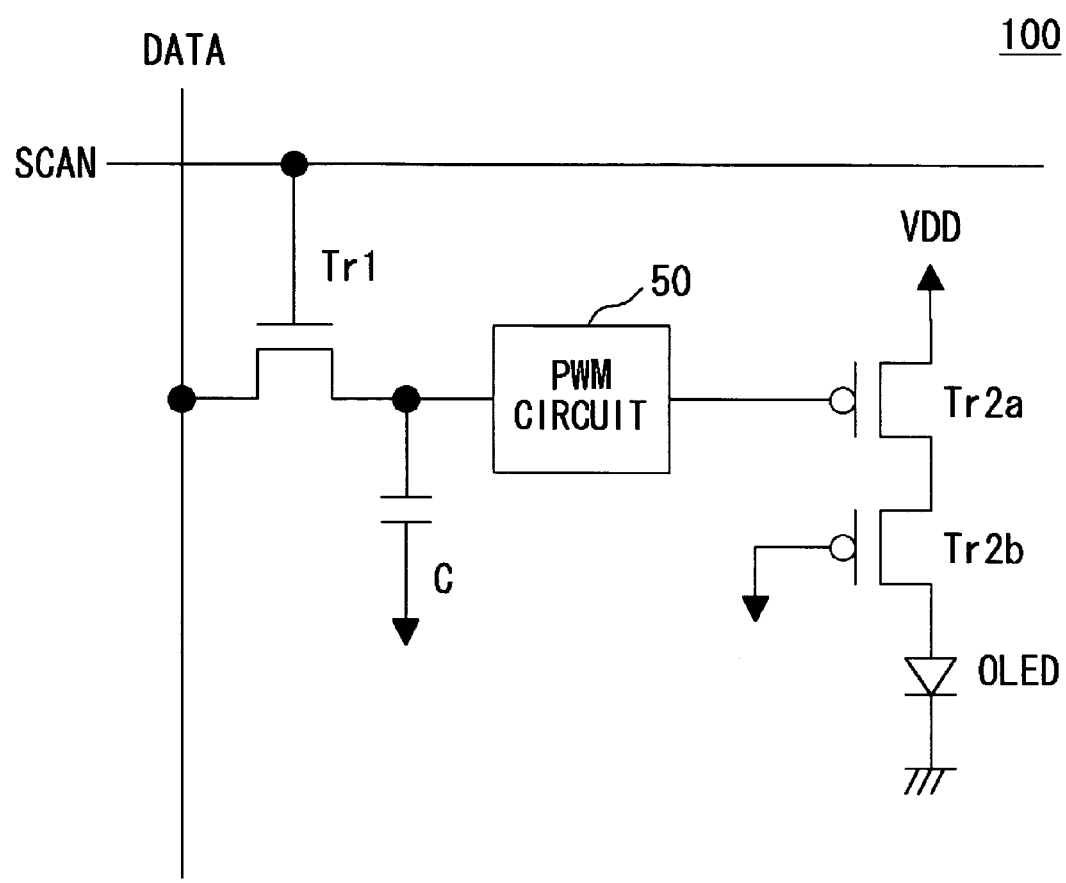
FIG. 6 is a circuit diagram of further another example of the pixel circuit.

FIG. 6 shows further another example of the pixel circuit 100. In the example of FIG. 6, a control signal, which is generated by a not-illustrated electric current control section to variably control the electric current, is inputted to the gate electrode of the driving transistor Tr2b functioning as the electric current adjustment element. Thus, since it is possible to actively control the electric current flowing through the organic light emitting element OLED, further effective electric current control is realized. The electric current adjustment function of this pixel circuit 100 will be described with reference to FIG. 4. By adjusting the gate voltage of the driving transistor Tr2b, the characteristic curve 220a shifts in the vertical direction, and the operating point 230a moves.

According to the technology of this embodiment, as described above, it is possible to minimize variation in luminance, due to variation in temperature and variation with time in the display element. Therefore, it is possible to prevent the burn-in of the display device, and to increase the life time thereof.

Second Embodiment

Figure 7:
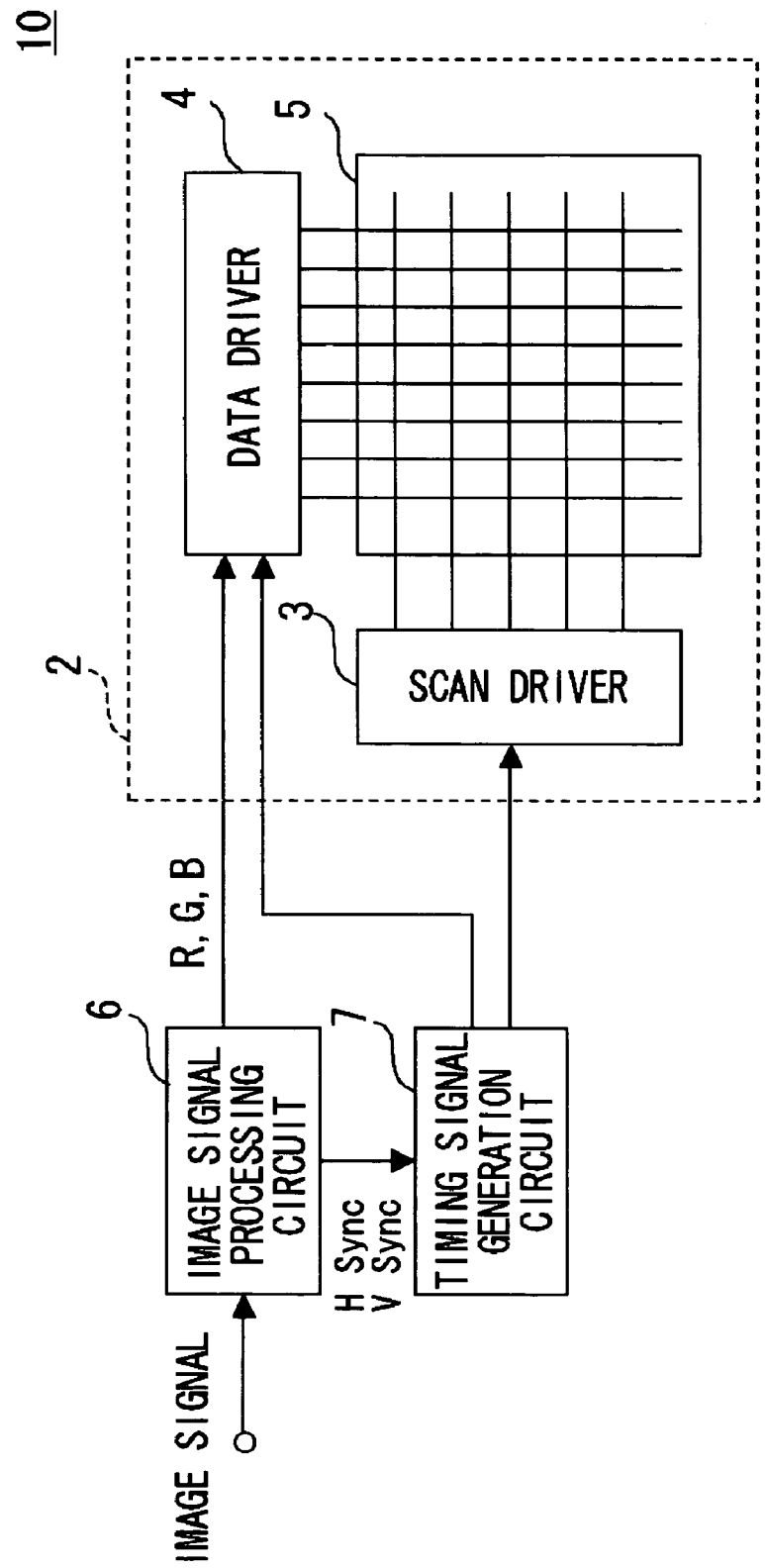
FIG. 7 is a block diagram showing the structure of an organic EL display device according to a second embodiment.

FIG. 7 shows the structure of an organic EL display device 10 according to a second embodiment. The organic EL display device 10 comprises an organic EL display unit 2, an image signal processing circuit 6 which processes an image signal, and a timing signal generation circuit 7 which generates timing signals which control the timing of display. The organic EL display unit 2 comprises an organic EL panel 5 in which a plurality of pixels are arranged in matrix, a scan driver 3 which supplies the organic EL panel 5 with scan signals, and a data driver 4 which supplies the organic EL panel 5 with luminance data signals.

The image signal processing circuit 6, which subjects the inputted image signal to necessary processing, outputs image signals of three primary colors of R, G and B to the data driver 4, and outputs a horizontal synchronization signal $H_{Sync}$ and a vertical synchronization signal $V_{Sync}$ to the timing signal generation circuit 7. The timing signal generation circuit 7 generates the timing signals for controlling the timing of display on the basis of the horizontal and vertical synchronization signals $H_{Sync}$ and $V_{Sync}$, and supplies the timing signals to the scan driver 3 and the data driver 4.

Figure 8:
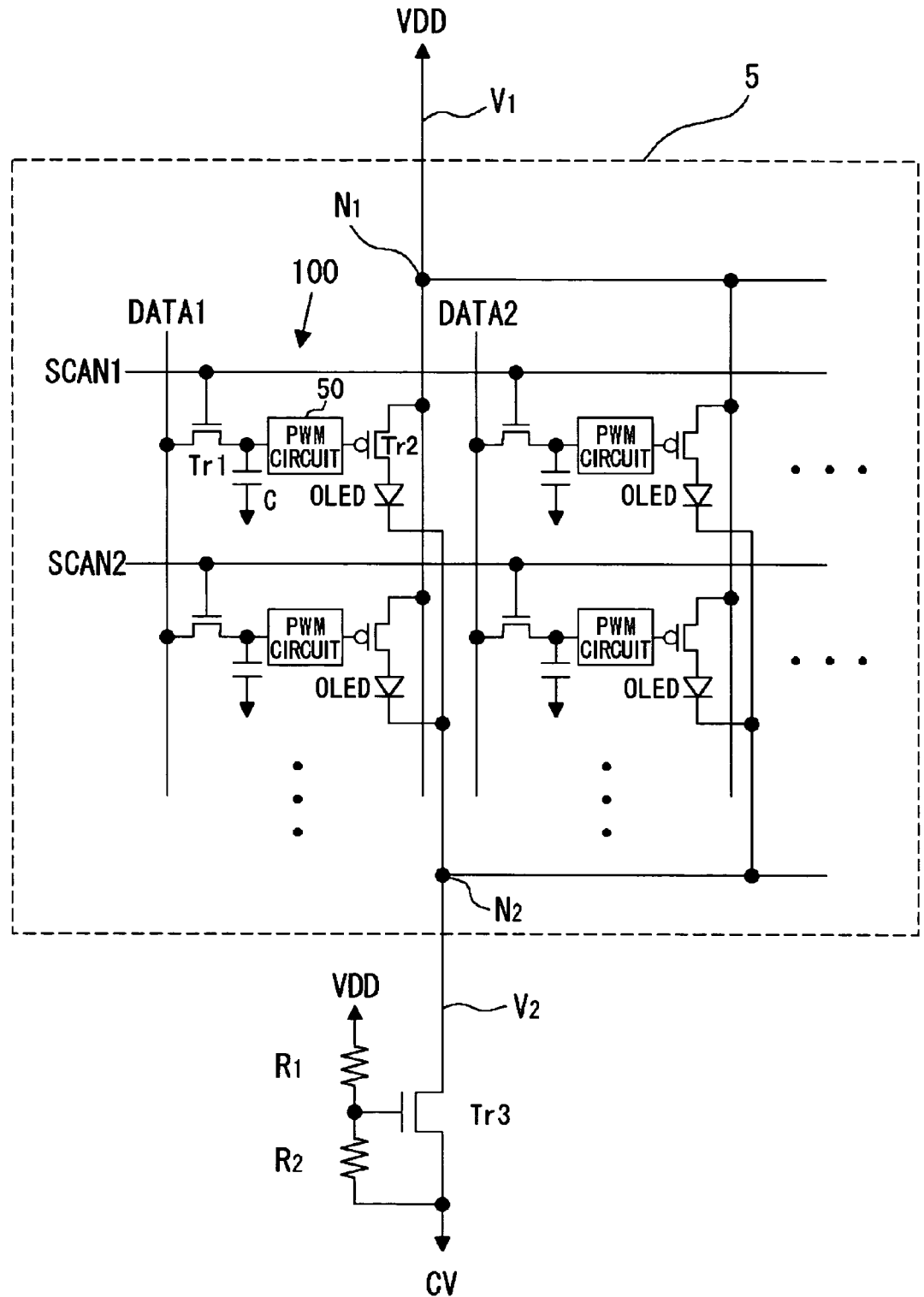
FIG. 8 is a circuit diagram showing the circuit structure of an organic EL panel according to the second embodiment.

FIG. 8 shows the circuit structure of the organic EL panel 5 according to this embodiment. A pixel circuit 100, which composes each pixel of the organic EL panel 5, comprises an organic light emitting element OLED, a switching transistor Tr1 which controls the timing of the writing of data to the organic light emitting element OLED, a driving transistor Tr2 which controls the energization of the organic light emitting element OLED, a holding capacitor C, a pulse width modulation (PWM) circuit 50 which modulates luminance data voltage into pulse width, a scan line SCAN for transmitting the scan signal, a data line DATA for transmitting luminance data, and power source lines V1 and V2 for supplying the organic light emitting element OLED with an electric current. The power source line V1 branches from a power source $V_{DD}$ on the side of high potential to each pixel circuit 100 at a node N1. The power source line V2 converging at a node N2 from each pixel circuit 100 is connected to a power source CV on the side of low potential. The data line DATA transmits a signal of luminance data to control the luminance of each organic light emitting element OLED. The scan line SCAN transmits the scan signal to control the light emission timing of each organic light emitting element OLED.

The gate electrode of the switching transistor Tr1 is connected to the scan line SCAN. The source electrode of the switching transistor Tr1 is connected to the data line DATA, and the drain electrode thereof is connected to the PWM circuit 50. The switching transistor Tr1 has any of single-gate structure, double-gate structure, and multi-gate structure with three or more gate electrodes. The switching transistor Tr1 is either of an N-channel transistor and a P-channel transistor. The source electrode and the drain electrode may be reversed to each other.

The source electrode of the driving transistor Tr2 is connected to the power source line V1. The drain electrode of the driving transistor Tr2 is connected to the anode of the organic light emitting element OLED, and the gate electrode thereof is connected to the PWM circuit 50. The driving transistor Tr2, as with the switching transistor Tr1, has any of single-gate structure, double-gate structure, and multi-gate structure with three or more gate electrodes. The driving transistor Tr2 may be either of an N-channel transistor and a P-channel transistor.

The anode of the organic light emitting element OLED is connected to the drain electrode of the driving transistor Tr2, and the cathode thereof is connected to the power source line V2. One end of the holding capacitor C is connected to the drain electrode of the switching transistor Tr1, and the other end is connected to not-illustrated wiring. The PWM circuit 50 is disposed between the drain electrode of the switching transistor Tr1 and the gate electrode of the driving transistor Tr2.

The electric current supplied from the power source $V_{DD}$ branches off at the node N1 of the power source line V1 to each pixel circuit 100. The electric current, flowing through the driving transistor Tr2 and the organic light emitting element OLED of each pixel circuit 100, converges to the node N2 of the power source line V2. Then, the electric current flows into the power source CV through an electric current adjustment transistor Tr3, which is an example of an electric current adjustment circuit. In this embodiment, the electric current adjustment transistor Tr3, which adjusts the electric current flowing through the organic light emitting element OLED, is disposed between the node N2 and the power source CV. By providing the electric current adjustment transistor Tr3, as described later, it is possible to reduce variation in electric current caused by variation in the characteristics of the organic light emitting element OLED with the lapse of time, variation in temperature and the like, so that the variation and dispersion of luminance are reduced.

In this embodiment, an electric current adjustment circuit is provided between the node N2, to which the power lines V2 from the respective pixel circuits 100 converge, and the power source CV, instead of providing the electric current adjustment circuit in each pixel. Thus, the single electric current adjustment circuit can adjust the electric current flowing through the organic light emitting diodes OLED of the whole pixels, and hence the circuit structure thereof is simplified. Since the electric current adjustment circuit may be provided outside the organic EL panel 5, the electric current adjustment transistor Tr3 is not limited to a thin film transistor (TFT). Another transistor such as a field effect transistor (FET), a bipolar transistor and the like is available as the electric current adjustment transistor Tr3, so that the range of choices of elements is extended. Furthermore, since the electric current adjustment circuit is provided outside the organic EL panel 5, there is the advantage that the temperature of the panel does not increase even if the electric current adjustment circuit is added.

The operation of the organic EL display device 10 having the foregoing structure will be described. First, the data driver 4 prepares luminance data of each line and supplies it to each data line DATA1, DATA2, . . . At this time, since the scan driver 3 sends the scan signal to the horizontal scan line SCAN into which data is written, the switching transistors Tr1 of the pixels in the horizontal line are turned on. Luminance data set in the data line DATA is set in the holding capacitor C, and is inputted to the PWM circuit 50. The PWM circuit 50 modulates the voltage of inputted luminance data into a pulse signal having width corresponding to the voltage. The pulse signal having predetermined amplitude becomes active in a period corresponding to the luminance data. The pulse signal outputted from the PWM circuit 50 is inputted to the gate electrode of the driving transistor Tr2. Since the driving transistor Tr2 is turned on only when the pulse signal is active, a predetermined amount of electric current is supplied to the organic light emitting element OLED, so that the organic light emitting element OLED emits light. At this time, the electric current supplied to the organic light emitting element OLED is adjusted by the function of the electric current adjustment transistor Tr3. The foregoing operation is repeated for every horizontal line to display an image of a single frame.

Figure 9:
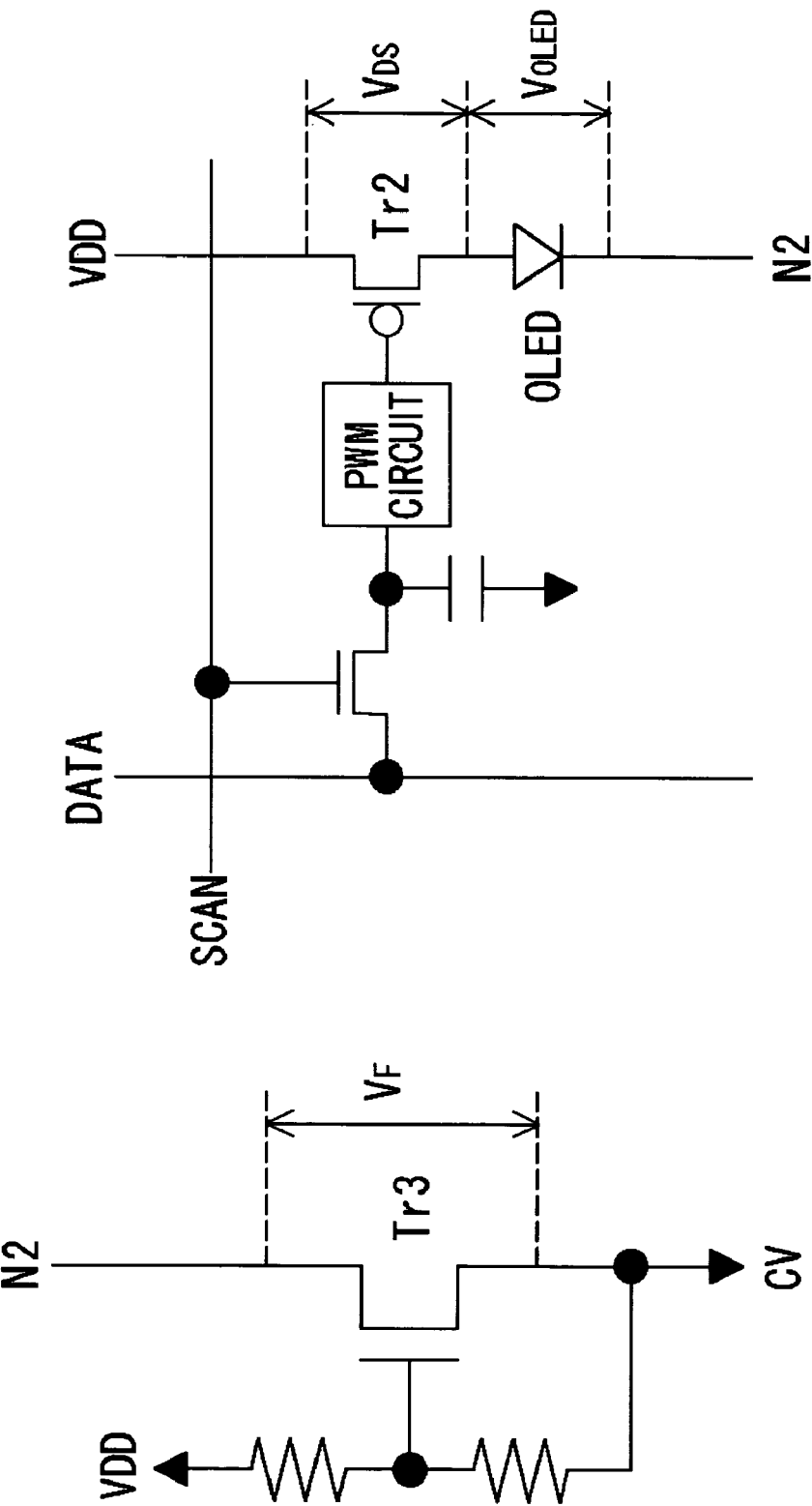
FIG. 9 is a circuit diagram showing the relation among the source-drain voltage of a driving transistor Tr2, the voltage between both electrodes of an organic light emitting element OLED and the source-drain voltage of an electric current adjustment transistor Tr3.

FIG. 9 shows the relation among the source-drain voltage of the driving transistor Tr2, the voltage between both electrodes of the organic light emitting element OLED, and the source-drain voltage of the electric current adjustment transistor Tr3. As shown in FIG. 9, $V_{DS}$ represents the source-drain voltage of the driving transistor Tr2. $V_{OLED}$ represents the voltage between the both electrodes of the organic light emitting element OLED, and $V_F$ represents the source-drain voltage of the electric current adjustment transistor Tr3.

Figure 10:
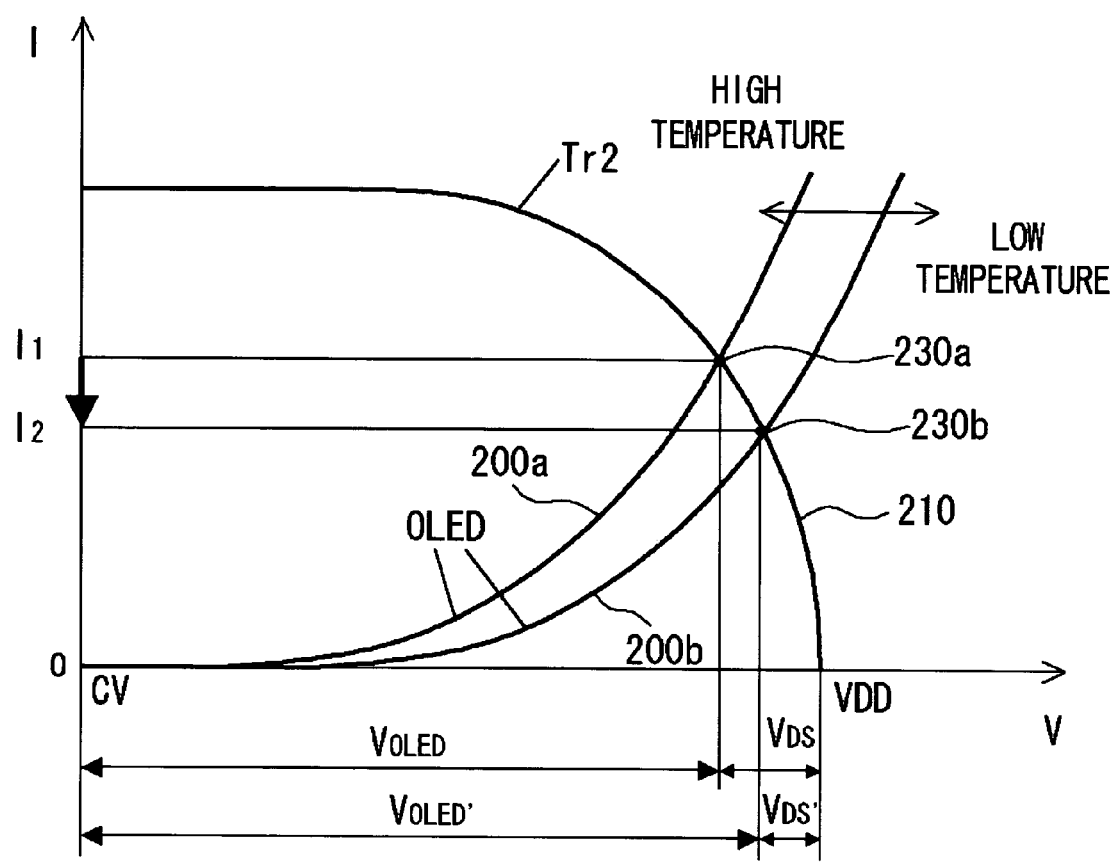
FIG. 10 is a graph explaining that the electric current flowing through the organic light emitting element OLED varies due to variation in temperature and variation with time, when an electric current adjustment element is not provided.

FIG. 10 is a graph explaining that an electric current flowing through the organic light emitting element OLED varies due to variation in temperature and variation with time, when the electric current adjustment element is not provided. 200a is the characteristic curve of the organic light emitting element OLED, and 210 is the characteristic curve of the driving transistor Tr2 at some point in time. At this time, the operating point of the driving transistor Tr2 is 230a, and an electric current of a current value I1 flows through the organic light emitting element OLED and the driving transistor Tr2.

It is known that the electric current becomes hard to flow through the organic light emitting element OLED with the lapse of light emission time, and its luminance decreases. In other words, the characteristic curve of the organic light emitting element OLED shifts in a right direction in FIG. 10 in accordance with degradation with time. The characteristic curve of the organic light emitting element OLED also shifts in the right direction in accordance with decrease in temperature. When the luminance and electric current decrease due to degradation with time, the temperature of the display panel decreases, and the characteristic curve shifts in the direction of further decreasing the electric current. Therefore, there is the fear of a vicious cycle in which the luminance further decreases.

When the characteristic curve of the organic light emitting element OLED shifts to 200b due to variation with time or decrease in temperature, the operating point moves to 230b, and the current value decreases to I2. At this time, the $V_{OLED}$ increases, and the $V_{DS}$ decreases.

Figure 11:
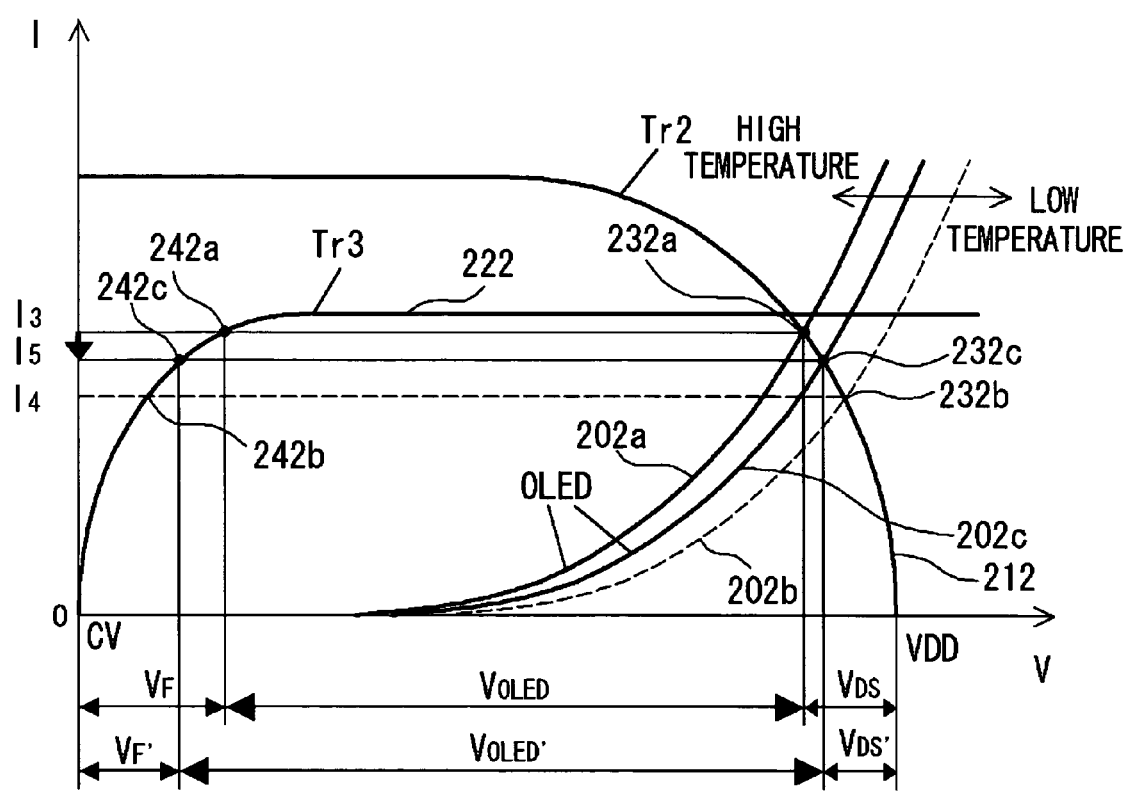
FIG. 11 is a graph explaining that the electric current adjustment transistor Tr3 reduces variation in electric current, when the electric current flowing through the organic light emitting element OLED varies due to variation in temperature and variation with time.

FIG. 11 is a graph explaining that the electric current adjustment transistor Tr3 reduces variation in electric current, when the electric current flowing through the organic light emitting element OLED varies due to variation in temperature and variation with time. In FIG. 11, for the sake of easily explaining, the characteristic curve of the driving transistor Tr2 is plotted with reference to the total amount of electric current flowing through the driving transistors Tr2 of the whole pixels. 202a is the characteristic curve of the organic light emitting element OLED at some point in time. 212 is the characteristic curve of the driving transistor Tr2, and 222 is the characteristic curve of the electric current adjustment transistor Tr3. Since the characteristic curve 202a of the organic light emitting element OLED is offset by the source-drain voltage $V_F$ of the electric current adjustment transistor Tr3, and shifts in a right direction, as compared with the case of FIG. 10. At this time, the operating point of the driving transistor Tr2 is 232a, and an electric current of a current value I3 flows through the organic, light emitting element OLED and the driving transistor Tr2.

Taking a case where the characteristic curve of the organic light emitting element OLED shifts in the right direction due to variation with time or decrease in temperature. At this time, if the voltage drop of the source-drain voltage $V_F$ of the electric current adjustment transistor Tr3 is not considered, the characteristic curve of the organic light emitting element OLED moves to 202b, and the operating point of the driving transistor Tr2 moves to 232b, so that the current value decreases to I4. When the electric current flowing through the electric current adjustment transistor Tr3 decreases, however, the operating point of the electric current adjustment transistor Tr3 shifts in a lower left direction, and the source-drain voltage $V_F$ drops. Thus, the electric potential of the cathode of the organic light emitting element OLED decreases, and the rising voltage of the characteristic curve drops, so that the characteristic curve of the organic light emitting element OLED shifts in a left direction. The characteristic curve of the organic light emitting element OLED is settled in 202c by the foregoing function, the operating point of the driving transistor Tr2 becomes 232c, and the current value becomes I5. Therefore, providing the electric current adjustment transistor Tr3 makes it possible to reduce decrease in electric current flowing through the organic light emitting element OLED, caused by decrease in temperature and variation with time.

When the temperature increases, on the other hand, the characteristic curve of the organic light emitting element OLED shifts in the left direction, so that the operating point of the driving transistor Tr2 shifts in an upper left direction, and the electric current increases. Then, since the temperature of the panel further increases, there is the fear of occurrence of thermal runaway. Also in this case, since the electric current adjustment function by the electric current adjustment transistor Tr3 works to shift the operating point in the direction of decreasing electric current, the thermal runaway is prevented. To be more specific, when the operating point 232a of the driving transistor Tr2 shifts in the upper left direction in accordance with increase in temperature, the electric current flowing through the organic light emitting element OLED increases, and the electric current flowing through the electric current adjustment transistor Tr3 also increases. Thus, the source-drain voltage $V_F$ of the electric current adjustment transistor Tr3 increases. As a result, since the characteristic curve of the organic light emitting element OLED shifts in the right direction, the function of returning the operating point of the driving transistor Tr2 in a lower right direction works. Therefore, it is possible to reduce increase in electric current due to increase in temperature.

The foregoing electric current adjustment function works in such a manner as to correct the total amount of electric current of the whole frame. This means that the electric current adjustment transistor Tr3 also functions as an automatic contrast limiter (ACL) circuit. That is to say, when a bright image in which there are many pixels with high luminance is displayed, the total amount of electric current flowing through the organic light emitting diodes OLED of the whole pixels is increased. The voltage drop of the electric current adjustment transistor Tr3, however, shifts the operating point of the driving transistor Tr2 in the direction of decreasing electric current, so that the total amount of electric current is restricted. Therefore, it is possible to reduce power consumption.

Third Embodiment

Figure 12:
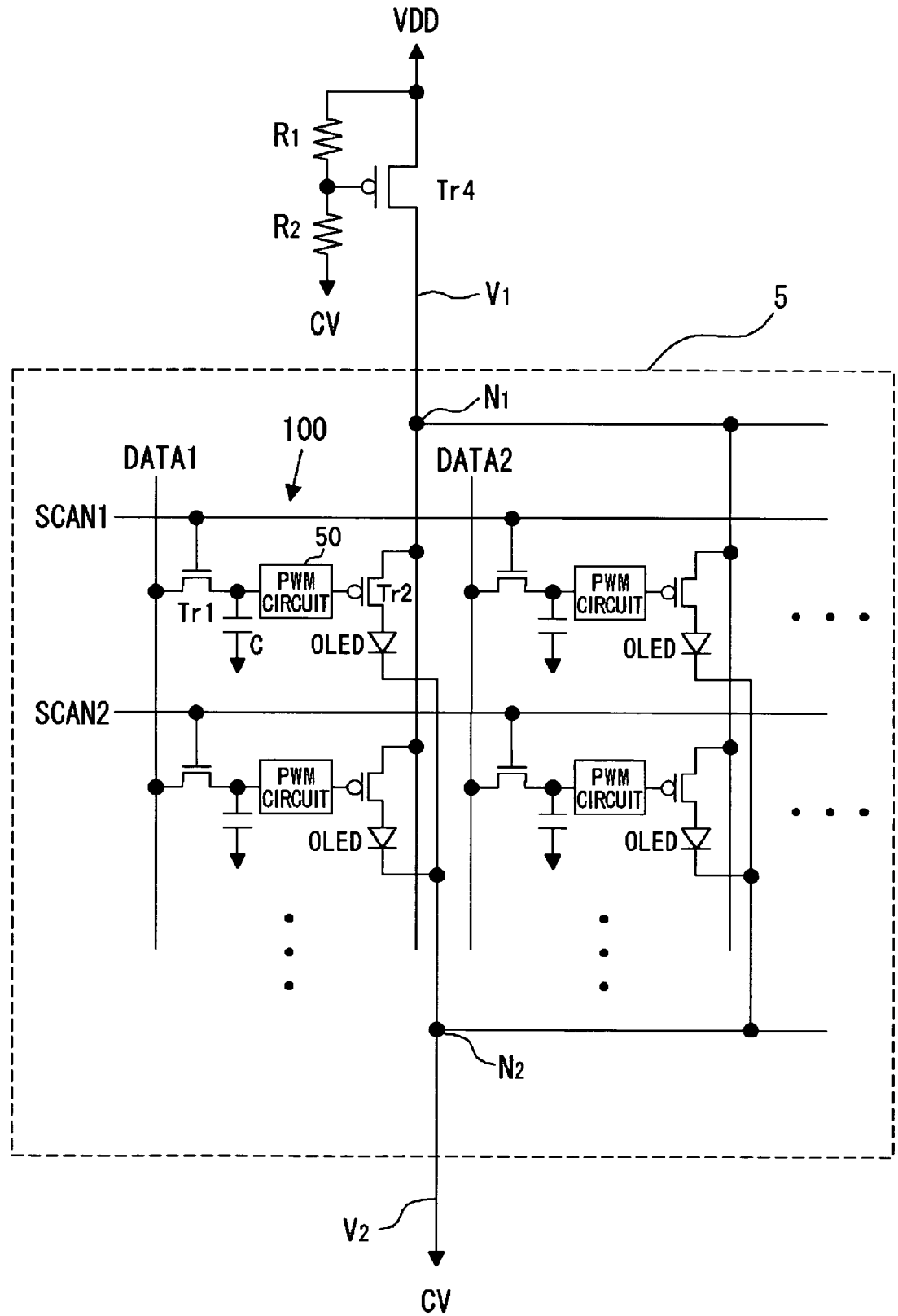
FIG. 12 is a circuit diagram showing the circuit structure of an organic EL panel according to a third embodiment.

FIG. 12 shows the circuit structure of an organic EL panel 5 according to a third embodiment. The structure of a pixel circuit 100 which composes each pixel of the organic EL panel 5 according to this embodiment is the same as that of the pixel circuit 100 shown in FIG. 8 according to the second embodiment. In this embodiment, an electric current adjustment transistor Tr4 functioning as an electric current adjustment circuit is disposed between a power source $V_{DD}$ on the side of high electric potential and a node N1. The other structure and operation are the same as those of the second embodiment.

Figure 13:
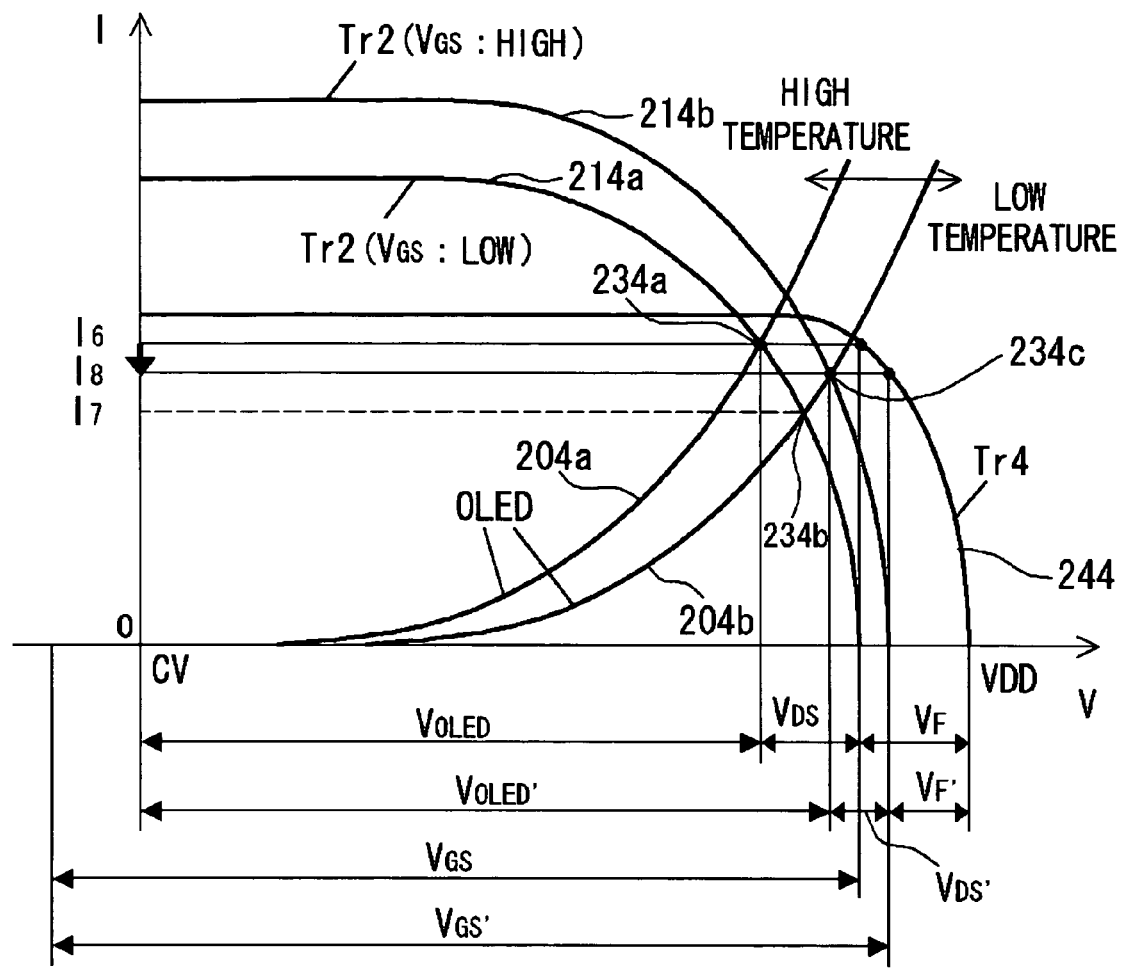
FIG. 13 is a graph explaining that an electric current adjustment transistor Tr4 reduces variation in electric current, when the electric current flowing through an organic light emitting element OLED varies due to variation in temperature and variation with time.

FIG. 13 is a graph explaining that the electric current adjustment transistor Tr4 reduces variation in electric current, when the electric current flowing through the organic light emitting element OLED varies due to variation in temperature and variation with time. In FIG. 13, for the sake of easily explaining, the characteristic curve of the driving transistor Tr2 is plotted with reference to the total amount of electric current flowing through the driving transistors Tr2 of the whole pixels. 204a is the characteristic curve of the organic light emitting element OLED, and 214a is the characteristic curve of the driving transistor Tr2 at some point in time. At this time, the operating point of the driving transistor Tr2 is 234a, and an electric current of a current value I6 flows through the organic light emitting element OLED and the driving transistor Tr2.

Taking a case where the characteristic curve of the organic light emitting element OLED shifts in a right direction in response to variation with time or decrease in temperature. At this time, the characteristic curve of the organic light emitting element OLED moves to 204b, and the operating point of the driving transistor Tr2 moves to 234b, so that the amount of electric cur-rent decreases to I7. When the electric current flowing through the electric current adjustment transistor Tr4 decreases, however, the operating point of the electric current adjustment transistor Tr4 moves in a lower right direction, so that the source-drain voltage $V_F$ of the electric current adjustment transistor Tr4 drops. Thus, the characteristic curve of the driving transistor Tr2 moves in the right direction, and the source voltage of the driving transistor Tr2 increases. Since the gate-source voltage $V_{GS}$ of the driving transistor Tr2 increases, the characteristic curve of the driving transistor Tr2 becomes 214b. Then, the operating point of the driving transistor Tr2 becomes 234c, and the amount of electric current becomes I8. Therefore, providing the electric current adjustment transistor Tr4 makes it possible to reduce decrease in electric current flowing through the organic light emitting element OLED, due to decrease in temperature and variation with time.

When the temperature increases, on the other hand, the characteristic curve of the organic light emitting element OLED shifts in a left direction, so that the operating point of the driving transistor Tr2 shifts in an upper left direction, and the electric current increases. At this time, since the electric current flowing through the electric current adjustment transistor Tr4 also increases, the source-drain voltage $V_F$ of the electric current adjustment transistor Tr4 increases. As a result, since the characteristic curve of the driving transistor Tr2 moves in a left direction, and then the gate-source voltage $V_{GS}$ of the driving transistor Tr2 drops. Thus, the characteristic curve of the driving transistor Tr2 moves downward, and the function of returning the operating point of the driving transistor Tr2 in the lower left direction works. Therefore, it is possible to reduce increase in electric current due to increase in temperature. Since the electric current adjustment transistor Tr4 according to this embodiment also functions as the ACL, as in the case of the second embodiment, it is possible to reduce power consumption.

In this embodiment, since the gate-source voltage $V_{GS}$ of the driving transistor Tr2 is corrected too, it is possible to realize a further effective electric current adjustment function. As apparent from the comparison between FIG. 11 and FIG. 13, to obtain the similar degree of correction effect, the source-drain voltage $V_F$ of the electric current adjustment transistor becomes lower in this embodiment, so that the power consumption of the electric current adjustment circuit is kept low.

Figure 14A:
FIGS. 14A to 14F are circuit diagrams showing other examples of an electric current adjustment circuit.
Figure 14B:
Figure 14C:
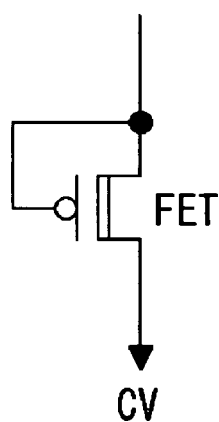
Figure 14D:
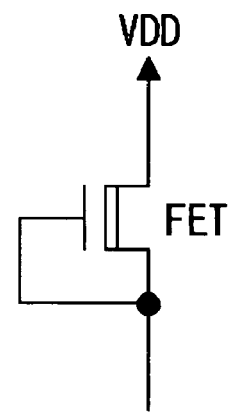
Figure 14E:
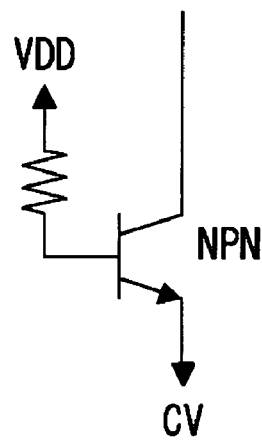
Figure 14F:
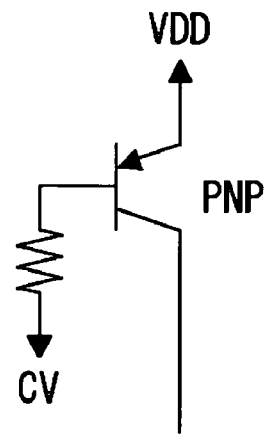

FIGS. 14A to 14F show other examples of the electric current adjustment circuit. FIG. 14A shows the example in which a resistor element is used as the electric current adjustment circuit of the second embodiment, and FIG. 14B shows the example in which a resistor element is used as the electric current adjustment circuit of the third embodiment. When an electric current flowing through the resistor element is increased or decreased, the voltage between both ends of the resistor element is increased or decreased. Thus, an electric current adjustment function works on the same principles described in the second and third embodiments. FIG. 14C shows the example in which a depletion-type FET is used as the electric current adjustment circuit of the second embodiment, and FIG. 14D shows the example in which a depletion-type FET is used as the electric current adjustment circuit of the third embodiment. FIG. 14E shows the example in which a bipolar transistor is used as the electric current adjustment circuit of the second embodiment, and FIG. 14F shows the example in which a bipolar transistor is used as the electric current adjustment circuit of the third embodiment. In using a transistor as the electric current adjustment circuit, as shown in FIGS. 11 and 13, it is possible to keep the power consumption of the electric current adjustment circuit low, because the electric current adjustment function is realized with the use of a region in which a characteristic curve is convex upward.

As described above, according to the technology of the foregoing embodiments, it is possible to minimize variation in luminance, due to variation in temperature and variation with time in the display element. Therefore, it is possible to increase the display quality of the display device and extend the life time thereof.

The foregoing description is based on the embodiments of the present invention. These embodiments have been given solely by way of illustration. It will be understood by those skilled in the art that various modifications may be made to combinations of the foregoing components and processes, and all such modifications are also intended to fall within the scope of the present invention.

In the above embodiments, the PWM circuit 50 generates the pulse signal having the pulse width in accordance with luminance data, to digitally drive the organic light emitting element OLED, but subfield drive may be adopted instead. The organic light emitting element is used in the foregoing embodiments, but the present invention is applicable to another current-driven light emitting element.

Although the present invention has been described by way of exemplary embodiments, it should be understood that many changes and substitutions may further be made by those skilled in the art without departing from the scope of the present invention which is defined by the appended claims.

What is claimed is:

1. A digital-driven display device comprising:
  a plurality of pixel circuits, each of the plurality of pixel circuits comprising
    a light emitting element which emits light when an electric current is supplied thereto, and
    a driving transistor which controls the supply of the electric current to the light emitting element and is operated in a linear region; and
  a power source line through which the electric current is supplied to the light emitting element of each pixel circuit,
  the power source line branching from a first power source on a side of high electric potential to each pixel circuit at a first node, and converging from each pixel circuit at a second node, and then being connected to a second power source on a side of low electric potential, and
  an electric current adjustment circuit which adjusts the electric current flowing through the light emitting element being disposed between the first node and the first power source, and
  when the electric current at the first node decreases, the electric current adjustment circuit increases the electric potential of the first node, in order to move an operating point of the driving transistor in a direction of increasing the electric current.

2. The display device according to claim 1, wherein the electric current adjustment circuit is a transistor.

3. The display device according to claim 1, wherein the electric current adjustment circuit is a resistor element.

4. A digital-driven display device comprising:
  a plurality of pixel circuits each of the plurality of pixel circuits comprising
    a light emitting element which emits light when an electric current is supplied thereto, and
    a driving transistor which controls the supply of the electric current to the light emitting element and is operated in a linear region; and
  a power source line through which the electric current is supplied to the light emitting element of each pixel circuit,
  the power source line branching from a first power source on a side of high electric potential to each pixel circuit at a first node, and converging from each pixel circuit at a second node, and then being connected to a second power source on a side of low electric potential, and
  an electric current adjustment circuit which adjusts the electric current flowing through the light emitting element being disposed between the second node and the second power source, and
  when the electric current at the second node decreases, the electric current adjustment circuit decreases the electric potential of the second node, in order to move an operating point of the driving transistor in a direction of increasing the electric current.

5. The display device according to claim 4, wherein the electric current adjustment circuit is a transistor.

6. The display device according to claim 4, wherein the electric current adjustment circuit is a resistor element.

* * * * *